(12) United States Patent
Wang et al.

(10) Patent No.: US 10,129,979 B2
(45) Date of Patent: Nov. 13, 2018

(54) PCB ASSEMBLY WITH MOLDED MATRIX CORE

(71) Applicant: Apple Inc., Cupertino, CA (US)

(72) Inventors: Albert Wang, Sunnyvale, CA (US); Paul A. Martinez, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/274,302

(22) Filed: Sep. 23, 2016

(65) Prior Publication Data
US 2018/0092210 A1    Mar. 29, 2018

(51) Int. Cl.
| | | |
|---|---|---|
| H05K 7/00 | (2006.01) |
| H05K 1/14 | (2006.01) |
| H05K 1/18 | (2006.01) |
| H05K 1/02 | (2006.01) |
| H05K 3/30 | (2006.01) |
| H05K 3/28 | (2006.01) |
| H05K 3/36 | (2006.01) |
| H05K 3/34 | (2006.01) |
| H05K 3/40 | (2006.01) |
| H05K 3/00 | (2006.01) |

(52) U.S. Cl.
CPC ........... *H05K 1/145* (2013.01); *H05K 1/0218* (2013.01); *H05K 1/0281* (2013.01); *H05K 1/0298* (2013.01); *H05K 1/181* (2013.01); *H05K 3/0047* (2013.01); *H05K 3/284* (2013.01); *H05K 3/303* (2013.01); *H05K 3/341* (2013.01); *H05K 3/361* (2013.01); *H05K 3/4038* (2013.01); *H05K 2201/042* (2013.01); *H05K 2201/0707* (2013.01); *H05K 2201/10522* (2013.01); *H05K 2201/10734* (2013.01); *H05K 2203/1316* (2013.01); *H05K 2203/1327* (2013.01)

(58) Field of Classification Search
CPC .... H05K 1/145; H05K 1/0218; H05K 1/0281; H05K 1/0298; H05K 1/181; H05K 3/0047; H05K 3/284; H05K 3/303; H05K 3/341
USPC .................................................. 361/792, 744
See application file for complete search history.

(56) References Cited

U.S. PATENT DOCUMENTS

| | | | | |
|---|---|---|---|---|
| 5,672,414 A | * | 9/1997 | Okamoto | H01L 23/24 257/E23.14 |
| 6,906,416 B2 | * | 6/2005 | Karnezos | H01L 21/563 257/723 |
| 6,917,526 B2 | * | 7/2005 | Ajioka | H01L 23/552 257/E23.114 |
| 6,972,964 B2 | | 12/2005 | Ho et al. | |

(Continued)

*Primary Examiner* — Hung S Bui
(74) *Attorney, Agent, or Firm* — Fletcher Yoder PC

(57) ABSTRACT

Methods and devices related to the design and fabrication of molded cores for printed circuit board assemblies and system-on-package (SIP) devices are discussed. The discussed printed circuit board assemblies may have multiple electrical components embedded in a molded core matrix and forming electrical connections with one or more printed circuit boards attached to the molded core matrix. Methods for sourcing of electrical components and production of the molded cores and printed circuit board assemblies are also discussed. The methods and devices may increase a volumetric density of electrical components in printed circuit board assemblies and provide improved mechanical properties to the electrical circuit device.

17 Claims, 10 Drawing Sheets

(56) References Cited

U.S. PATENT DOCUMENTS

| | | | |
|---|---|---|---|
| 7,061,087 B2* | 6/2006 | Kim | H01L 25/105 257/686 |
| 7,112,875 B1* | 9/2006 | Miks | H01L 21/561 257/679 |
| 7,183,643 B2* | 2/2007 | Gibson | H05K 1/112 257/686 |
| 7,259,077 B2 | 8/2007 | Degani et al. | |
| 7,312,529 B2* | 12/2007 | Clevenger | H01L 23/13 257/738 |
| 7,359,213 B2 | 4/2008 | Vasudivan et al. | |
| 7,782,624 B2* | 8/2010 | Fujii | H01L 23/3128 257/686 |
| 8,158,510 B2 | 4/2012 | Lin | |
| 8,767,409 B2* | 7/2014 | Cheng | H01L 23/552 361/763 |
| 9,167,686 B2* | 10/2015 | Chen | H01L 23/3121 |
| 9,801,298 B2* | 10/2017 | Kawano | H05K 7/1427 |
| 2006/0118931 A1 | 6/2006 | Ho et al. | |
| 2007/0025092 A1 | 2/2007 | Lee et al. | |

* cited by examiner

PCB ASSEMBLY WITH MOLDED MATRIX CORE

BACKGROUND

The present disclosure relates generally to printed circuit board and printed circuit board assemblies, and more specifically, to printed circuit board assemblies that may employ molded cores that in the design and fabrication of the electrical devices that may include printed circuit boards.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electrical devices and systems may include multiple electrical circuits to implement analog and digital computations, perform logic functions, transmit data over communication channels, obtain sensor data, and other related functions. Several of the electrical circuits may be implemented through soldering of electronic components to printed circuit boards (PCBs). To that end, PCBs may contain pads that provide electrical contacts for the terminals of the electrical components, and traces that provide electrical routes and connections between the pads electrical components.

Usually, the design and fabrication of printed circuit board assemblies involve attachment of each electrical components to a single PCB side of a PCB. Moreover, the attachment between the electrical components to the PCB is usually made through individual attachment of electrical components to the printed circuit board. The PCBs with appropriately attached electrical components may form a printed circuit board assembly, which may be incorporated into the electrical devices during manufacturing. This type of construction may lead to inefficient use of the available space, uneven mechanic properties throughout the printed circuit board assembly, and quality control issues during the assembly.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a printed circuit board assembly is described. The printed circuit board assembly may include a first printed circuit board having a first and a second electrical component mounted to it. Heights of the first and the second components, as measured along a direction perpendicular to the first printed circuit board, may be substantially identical. The printed circuit board assembly may have a second printed circuit board such that the first and the second electrical component are also mounted to the second printed circuit board. The printed circuit board assembly may also have a mold that occupies all portions between the first and the printed circuit board that are unoccupied by any electrical component that may be disposed between the first and the second printed circuit board.

In another embodiment, a device is provided. The device may include a first electrical component and a second electrical component, both of which may have substantially similar heights as measured along a direction perpendicular to a specific plane. The device may also have a mold that supports the first and the second electrical components. Further, the mold may have a thickness substantially similar to the height of the first and the second electrical components.

A method to produce printed circuit boards is also discussed. The method may include a disposition of a set of electrical components on a place such that heights of the electrical components of the set of electrical components are substantially similar, the heights being measured in a direction perpendicular to the plane. The method may also include an application of mold material about the set of electrical components such that the mold has a thickness substantially similar to the heights of the electrical components.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
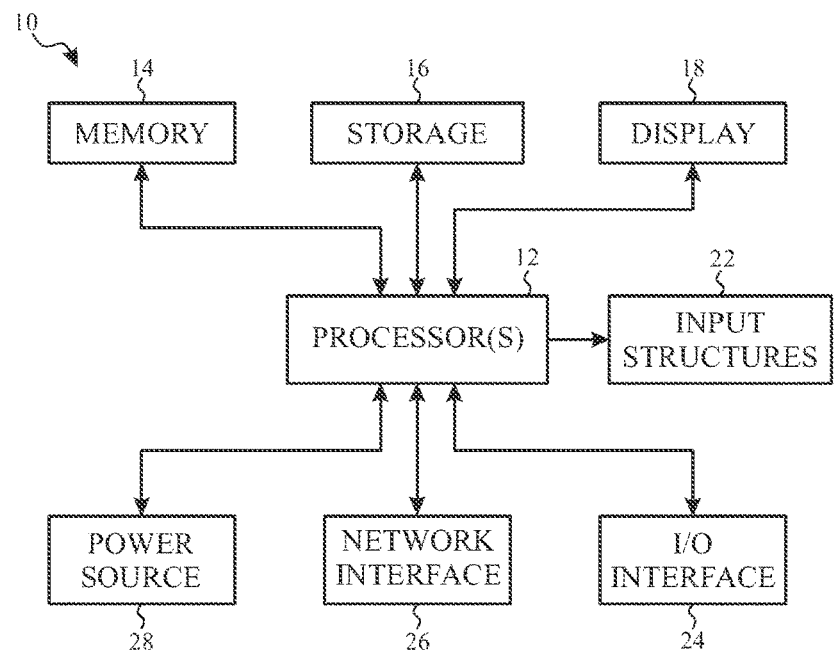
FIG. 1 is a diagram of an electrical device that may benefit from the inclusion of one or more printed circuit board assemblies with a core matrix, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Some of the descriptions may employ terms such as "coupling" or "connected" between two devices. Terms such as "coupled" and "electrically coupled" are intended to mean that the two devices may form an electrical circuit of some kind while "directly coupled" or "directly connected" is intended to mean that there is a physical connection between the two devices. Terms such as "operably coupled" are intended to mean that the two devices may be coupled in a manner that allows for proper function of the modules.

The disclosed embodiments relate to systems and devices for the design, fabrication, and utilization of printed circuit board assemblies that may present a molding material that forms a core of the printed circuit board assembly. The molding material may embed multiple electronic components to obtain a functional module of the electrical device. Such printed circuit board assembly may be a system-in-package (SIP). The use of molding materials may have the benefit of increasing the amount electrical components in a volume by decreasing the amount of empty space in the printed circuit board assembly.

In some applications, the molding material with embedded electronic components may be attached to a printed circuit board (PCB) to form a molding core matrix for the printed circuit board assembly. The molding material may provide mechanical stiffness to a region of the printed circuit board, which may reduce vibrations and/or improve resistance against impact. The molding material may also facilitate the assembly of the printed circuit board by allowing a single step soldering between a single core matrix and the PCBs instead of individual soldering of each components.

Moreover, the design and fabrication methods may lead to a printed circuit board assembly that may have multiple PCBs, and in some embodiments, an electrical component may be attached to more than one PCB. To that end, electrical components may be arranged based on their dimensions and disposition of the terminals. The use of standard case sizes for the electrical components may further facilitate the production of printed circuit board assemblies with molded core. The PCB assemblies described herein may also have multiple regions having molds with distinct thicknesses, and flexible regions not affixed to a mold or molding material. Printed circuit board assemblies with molded matrix, as described herein, may also have shielding layers and constructs, as detailed below.

With the preceding in mind, a general description of suitable electronic devices that may include and use the printed circuit assemblies that include the mold matrix cores described above is provided. FIG. 1 is a block diagram of an electronic device 10, in accordance with an embodiment of the present disclosure. The electronic device 10 may include, among other things, one or more processor(s) 12, memory 14, storage or nonvolatile memory 16, a display 18, input structures 22, an input/output (I/O) interface 24, network interface 26, and a power source 28. The various functional blocks shown in FIG. 1 may include hardware elements (including circuitry), software elements (including computer code stored on a computer-readable medium), or a combination of both hardware and software elements. Embodiments of the printed circuit board assembly or SIPs described herein may be used in the circuitry of the various functional blocks of FIG. 1 to improve a performance of software and hardware elements. It should be noted that FIG. 1 is merely one example of a particular implementation and is intended to illustrate the types of components that may be present in electronic device 10.

Figure 2:
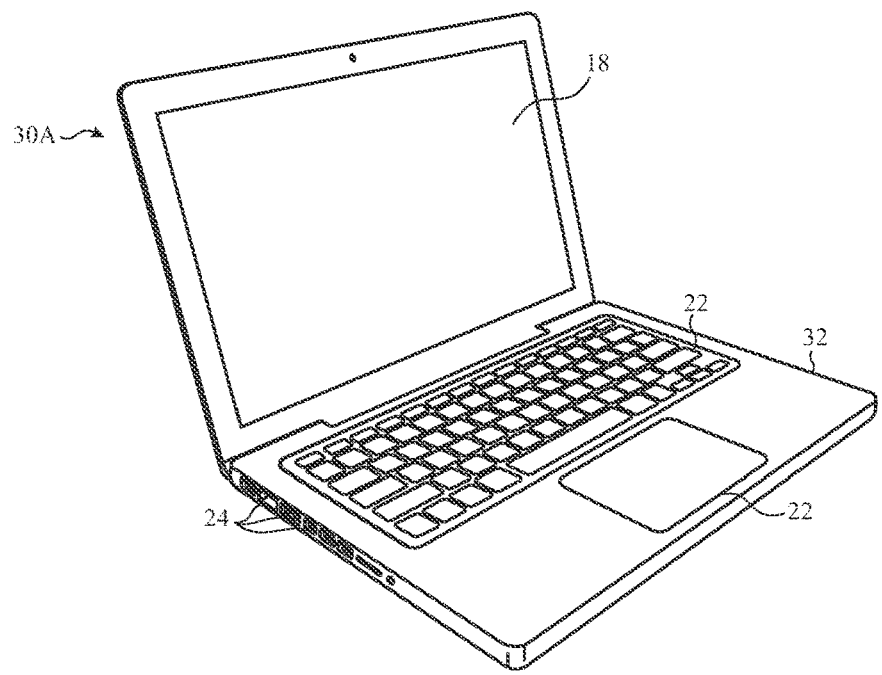
FIG. 2 is a perspective view of a notebook computer that may include printed circuit board assemblies, in accordance with an embodiment.
Figure 3:
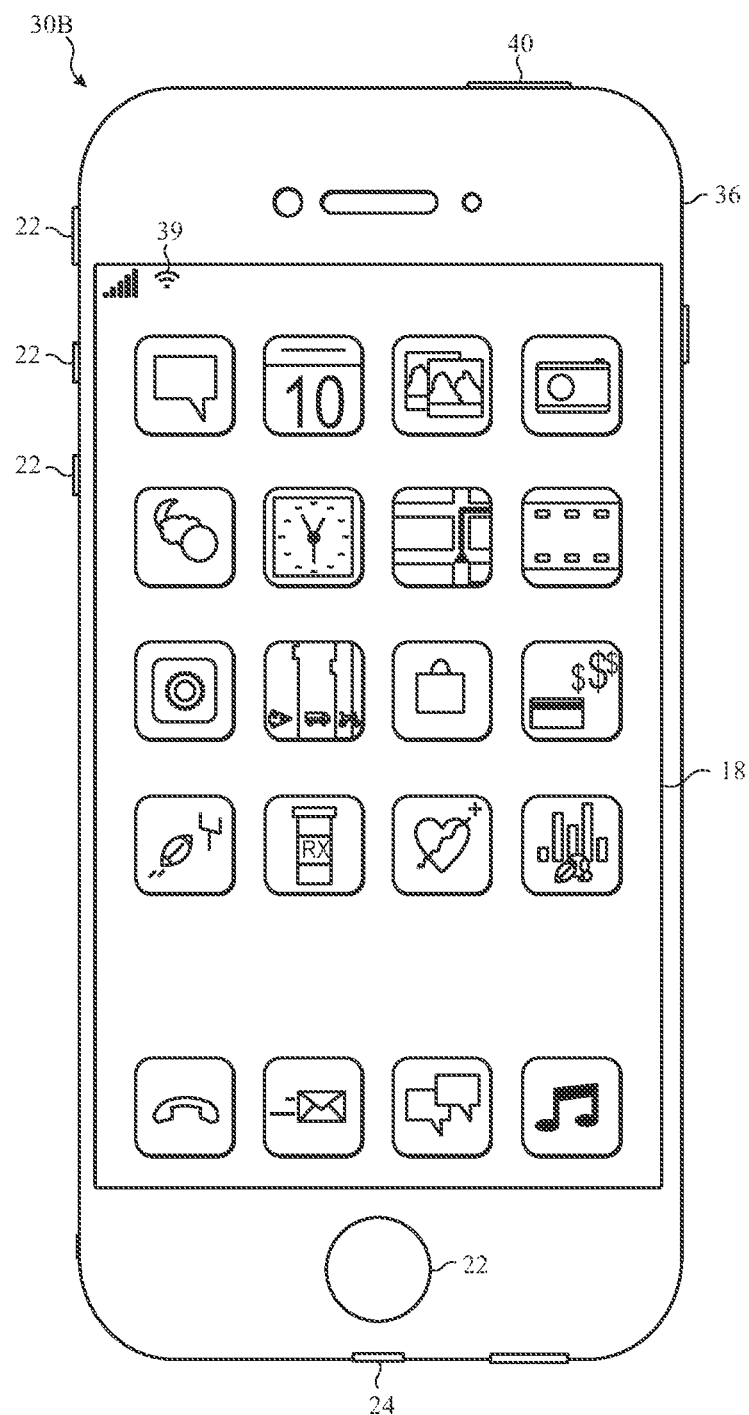
FIG. 3 is a front view of a hand-held device that may include a printed circuit board assembly, in accordance with an embodiment.
Figure 4:
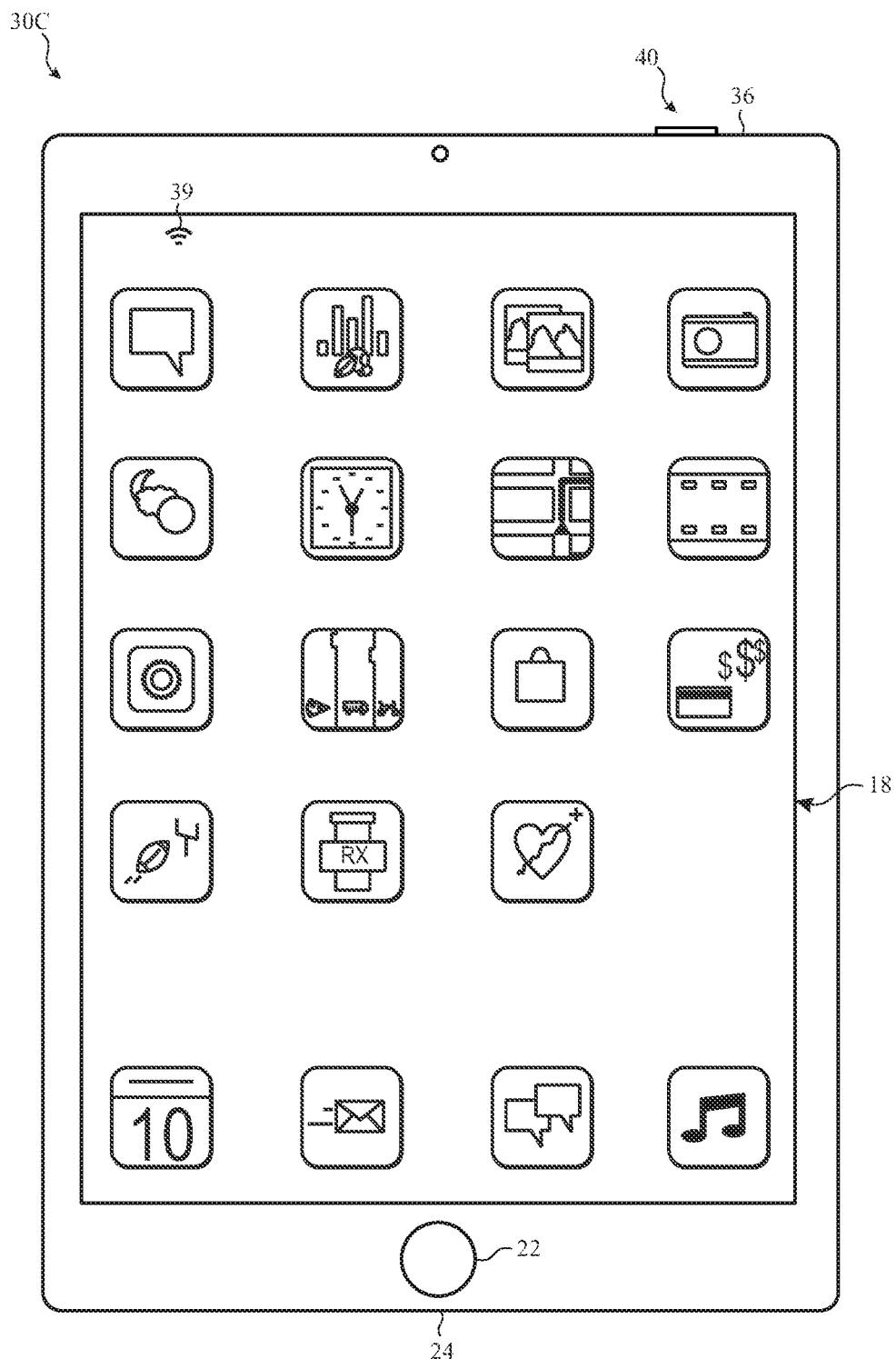
FIG. 4 is a front view of portable tablet computer that may include a printed circuit board assembly, in accordance with an embodiment.
Figure 5:
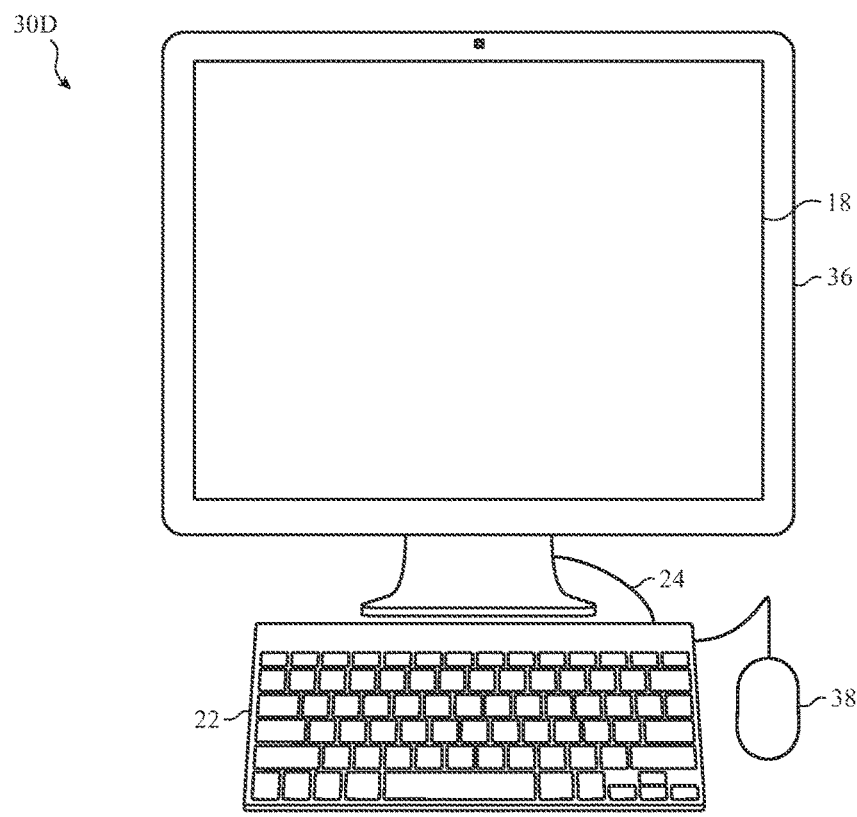
FIG. 5 is a diagram of a desktop computer that may benefit from the inclusion of one or more printed circuit board assemblies, in accordance with an embodiment.
Figure 6:
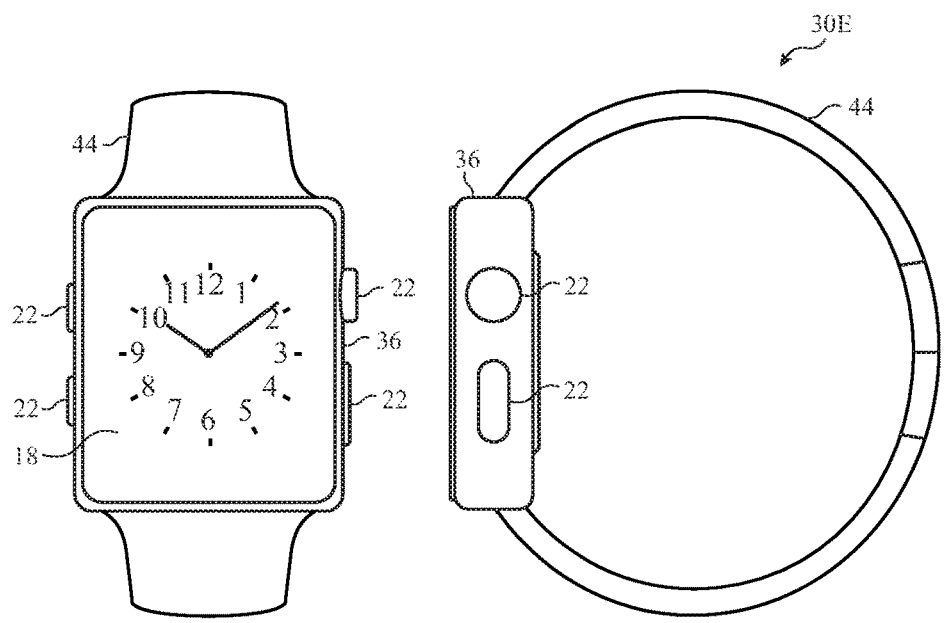
FIG. 6 presents a front and a side view of a wearable electrical device that may include a printed circuit board assembly, in accordance with an embodiment.

By way of example, the electronic device 10 may represent a block diagram of a notebook computer 30A depicted in FIG. 2, handheld devices 30B, 30C depicted in FIG. 3 and FIG. 4, a desktop computer 30D depicted in FIG. 5, a wearable electronic device 30E depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile storage 16 to perform various algorithms. Such programs or instructions executed by the processor(s) 12 may be stored in any suitable article of manufacture or computer program product that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Moreover, programs (e.g., an operating system) encoded on the memory 14 or the nonvolatile storage 16 may also include instructions that may be executed by the processor(s) 12 to allow the electronic device 10 to provide various functionalities.

In certain embodiments, the display 18 may be a liquid crystal display (e.g., LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more light emitting diode (e.g., LED, OLED, AMOLED, etc.) displays, or some combination of LCD panels and LED panels.

The input structures 22 of the electronic device 10 may allow a user to interact with the electronic device 10 (e.g., pressing a button to increase or decrease a volume level). The I/O interface 24 may allow electronic device 10 to interface with various other electronic devices. The I/O interface 24 may include various communications interfaces, such as universal serial bus (USB) ports, serial communications ports (e.g., RS232), Apple's Lightning® connector, or other communications interfaces. The network interface 26 may also allow electronic device 10 to interface with various other electronic devices and may include, for example, interfaces for a personal area network (e.g., PAN), such as a Bluetooth network, for a local area network (e.g., LAN) or wireless local area network (e.g., WLAN), such as an 802.11x Wi-Fi network, and/or for a wide area network (e.g., WAN), such as a $3^{rd}$ generation (e.g., 3G) cellular network, $4^{th}$ generation (e.g., 4G) cellular network, or long term evolution (e.g., LTE) cellular network. The network interface 26 may include an interface for, for example, broadband fixed wireless access networks (e.g., WiMAX), mobile broadband Wireless networks (e.g., mobile WiMAX), asynchronous digital subscriber lines (e.g., ADSL, VDSL), digital video broadcasting-terrestrial (DVB-T) and its extension DVB Handheld (DVB-H), Ultra-Wideband (UWB), alternating current (AC) power lines, and so forth.

In some applications, input structures 22, the I/O interfaces 24, and/or network interfaces 26 may be implemented in SIPs that include electrical circuits formed by the PCBs and the attached electrical components and are responsible for performing part of the functions described above. Note that a SIP may be integrated into the device through exposed terminals that may be disposed in flexible regions of the printed circuit board assembly, or through sockets and plugs disposed in the PCB.

As further illustrated, the electronic device 10 may include a power source 28. The power source 28 may include any suitable source of power, such as a rechargeable lithium polymer (e.g., Li-poly) battery and/or an alternating current (e.g., AC) power converter. The power source 28 may be removable, such as replaceable battery cell.

In certain embodiments, the electronic device 10 may take the form of a computer, a portable electronic device, a wearable electronic device, or other type of electronic device. Such computers may include computers that are generally portable (e.g., such as laptop, notebook, and tablet computers) as well as computers that are generally used in one place (e.g., such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of the notebook computer 30A, is illustrated in FIG. 2 in accordance with an embodiment of the present disclosure. The depicted computer 30A may include a housing or enclosure 32, a display 18, input structures 22, and ports of the I/O interface 24. In one embodiment, the input structures 22 (e.g., such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents an embodiment of the electronic device 10. The handheld device 30B may represent, for example, a portable phone, a media player, a personal data organizer, a handheld game platform, or any combination of such devices. By way of example, the handheld device 30B may be a model of an iPod® or iPhone® available from Apple Inc. of Cupertino, Calif. FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

The handheld devices 30B and 30C may each include similar components. For example, an enclosure 36 may protect interior components from physical damage. Enclosure 36 may also shield the handheld devices 30B and 30C from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a connector and protocol, such as the Lightning connector provided by Apple Inc., a universal service bus (e.g., USB), one or more conducted radio frequency connectors, or other connectors and protocols.

User input structures 22, 40, in combination with the display 18, may allow a user to control the handheld devices 30B or 30C. For example, the input structure 40 may activate or deactivate the handheld device 30B or 30C, one of the input structures 22 may navigate a user interface of the handheld device 30B or 30C to a home screen, a user-configurable application screen, and/or activate a voice-recognition feature of the handheld device 30B or 30C, while other of the input structures 22 may provide volume control, or may toggle between vibrate and ring modes. In the case of the handheld device 30B, additional input structures 22 may also include a microphone may obtain a user's voice for various voice-related features, and a speaker to allow for audio playback and/or certain phone capabilities. The input structures 22 may also include a headphone input to provide a connection to external speakers and/or headphones.

Turning to FIG. 5, a computer 30D may represent another embodiment of the electronic device 10 of FIG. 1. The computer 30D may take any suitable form of computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (e.g., PC) by another manufacturer. A similar enclosure 36 may be provided to protect and enclose internal components of the computer 30D such as a dual-layer display. In certain embodiments, a user of the computer 30D may interact with the computer 30D using various peripheral input devices, such as input structures 22 (e.g., the keyboard or mouse 38), which may connect to the computer 30D via a wired I/O interface 24 and/or wireless I/O interface.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 44, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen (e.g., LCD, OLED display, active-matrix organic light emitting diode (e.g., AMOLED) display, and so forth), which may allow users to interact with a user interface of the wearable electronic device 30E.

Figure 7:
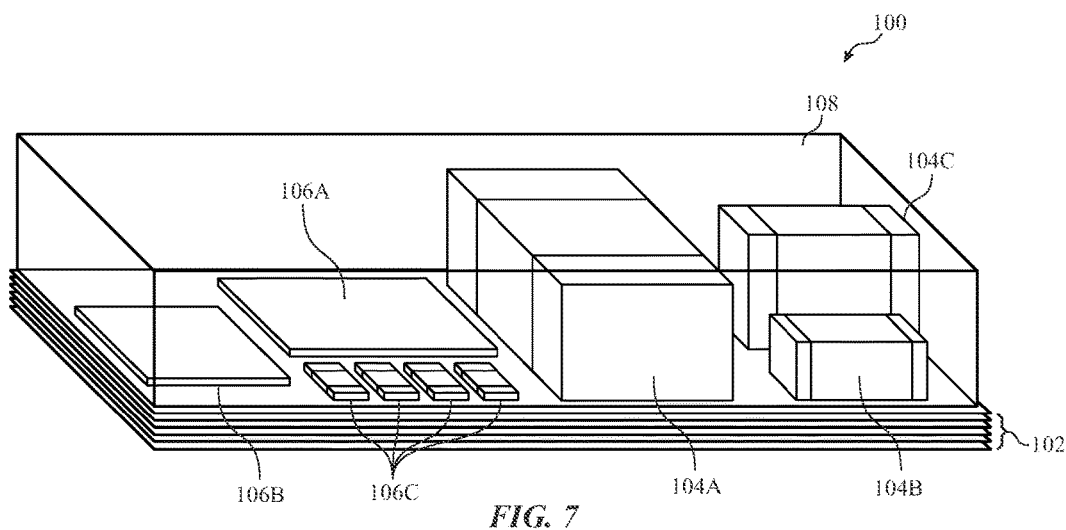
FIG. 7 presents a perspective view of a printed circuit board assembly with a molding disposed on top of a PCB and that may be used in conjunction with any of the devices of FIGS. 1-6, in accordance with an embodiment.

As discussed above, electronic devices, such as electronic devices 30A-E described above may include functionalities that may be implemented with SIPs that may integrate multiple electrical components into an electrical circuit. Printed circuit board assembly 100 illustrated in FIG. 7 provides an example of such a SIP. The printed circuit board assembly may include a multilayer PCB 102 that may have routes and pads stenciled or printed in its surface.

Electrical components such as discrete components 104A, 104B, and 104C may be attached to a surface of the PCB 102. Moreover, other types of electrical components such as integrated circuits 106A, 106B, and 106C may also be attached to a surface of the PCB102. Note that electrical components may include but are not limited to integrated circuits 106A-C, or discrete components 104A-C, such as resistors, capacitors, and inductors, or semiconducting components such as transistors, diodes, and other electrical components known in the art. Moreover, note that integrated circuits 106A-C may be processors, programmable logic devices (PLD), memory elements, digital circuits, amplifiers, oscillators, and other electrical devices that may be packaged in integrated circuits.

The PCB 102 may have a molding material 108 that surrounds a volume on the top of the PCB 102 not occupied by any of the electrical components, such as discrete components 104A-C or integrated circuits 106A-C. Note that the electrical components may directly coupled to PCB 102, i.e., the molding material does not prevent physical contact between discrete components 104A-C and integrated circuits 106A-C. The molding material 108 may facilitate the construction and fabrication of the printed circuit board assembly, as detailed below. Moreover, the material 108 may provide mechanical stiffness to the printed circuit board assembly, which may decrease damage from impact and/or vibrations suffered by the electrical device.

Figure 8:
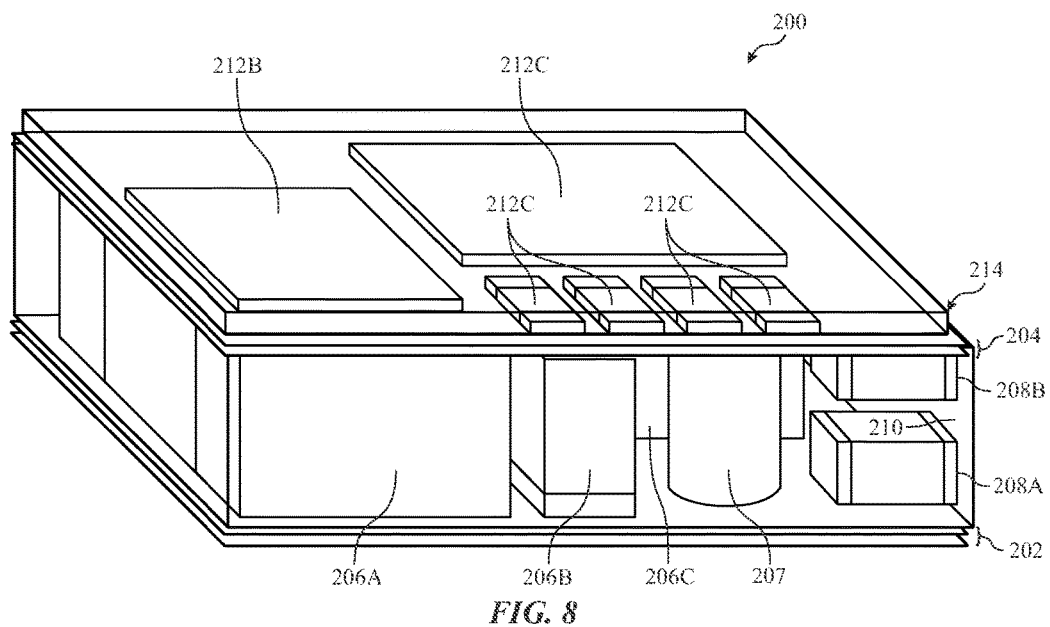
FIG. 8 presents a perspective view of a printed circuit board assembly with a molding disposed between two PCBs and that may be used in conjunction with any of the devices of FIGS. 1-6, in accordance with an embodiment.

Note that the thickness of the molding material 108, as measured along a direction perpendicular to the PCB 102 surface, may be determined by the dimension of the tallest electronic component, such as discrete component 104A. Moreover, note that the printed circuit board assembly 100 may include large empty volumes (i.e., volumes without electrical components) within the molding material 108 such as the regions above integrated circuits 106A-C. The printed circuit board assembly 200 of FIG. 8 illustrates a design that reduces the empty volumes, which may lead to smaller electrical devices.

To that end, printed circuit board assembly 200 has a bottom PCB 202 and a top PCB 204, with electrical components such as components 206A, 206B, 206C, 208A, and 208B placed between the bottom PCB 202 and the top PCB 204. A thru-mold via 207 may also be used to couple the bottom PCB 202 and the top PCB 204. The components 206A-C, and 208A-B, and the thru-mold via 207 may be embedded within a molding material 210.

Note that some components, such as component 206B and thru-mold via 207 may be directly coupled to the bottom PCB 202 and the top PCB 204. Other electrical components such as component 206A and 206C may be physically contacting both the bottom PCB 202 and the top PCB 204, but it may be directly coupled to only one of the two PCBs 204 and 206. Furthermore, component 208A may be directly coupled with the bottom PCB 202 while component 208B may be directly coupled with the top PCB 204.

In the illustrated printed circuit board assembly 200, IC 212A and 212B, and two-terminal electrical components 212C may be coupled to the top PCB 204. Note that the ICs 212A and 212B, and electrical components 212C are coupled to the surface of top PCB 204 opposite to the molding material 210 and are not embedded within molding material 210. A second molding material 214 may be disposed to enclose ICs 212A and 212B, and electrical components 212C. Due to the reduced height of components 212A-C relative to components 206A, the second molding material 214 may be thinner than the molding material 210. As a result, the density of electrical components may increase, which may lead to reduction of the dimensions of the electrical device employing the printed circuit board assembly.

As mentioned above, electrical component 206B may be electrically coupled to both the bottom PCB 202 and the top PCB 204. Moreover, a thru-mold via 207 may be incorporated in the printed circuit board assembly 200 to couple electrically the bottom PCB 202 and the top PCB 204. Note that this allows the design of an electrical circuit that is shared across the bottom PCB 202 and the top PCB 204. The thru-mold via 207 may also allow an electrical coupling between electrical components mounted to the top PCB 204, such as IC 212A and electrical component 208B, to the bottom PCB 202. In some implementations, the resulting electrical coupling is a resistive electrical coupling.

As discussed above, a component may be substantially in physical contact with both the bottom PCB 202 and the top PCB 204, but be only directly coupled to one of the layers, such as electrical component 206A. This may be accomplished by adequate placement of exposed terminals in the PCBs 202 and 204 relative to the placement of the terminals of the electrical component 206A. For example, if a direct coupling between electrical component 206A and bottom PCB 202 is desired, the contact region between the terminals of component 206A should be aligned with a conductive region (e.g., a pad) of the bottom PCB 202. Accordingly, if the coupling between electrical component 206A and top PCB 204 is undesirable, the contact region between the terminals of component 206A and the top PCB 204 should not have a substantial resistive nor capacitive coupling (i.e., the contact region should be electrically insulated).

As discussed above, multiple electrical components may be in physical contact with both the bottom PCB 202 and the top PCB 204. To that end, it may be useful to have electrical components that follow a standard height (as measured along a dimension perpendicular to the surface of the PCBs 202 and 204), and use a molding material 210 with a thickness substantially close to that height. For example the electrical component may be selected from standards to provide a prescribed height of 0.2 mm, 0.3 mm, 0.4 mm, 0.5 mm, 0.6 mm, 0.8 mm, 1.0 mm, 1.25 mm 1.5 mm, 1.6 mm, 2.0 mm, 2.5 mm, 3.2 mm, 4.5 mm, 5.0 mm, 6.3 mm, 5.1 mm, 7.3 mm, or 7.4 mm, or any other adequate height. The standardized height is not limited to metric units and may be prescribed in imperial units. Standards, such as the ones defined by the Electronics Industries Alliance (EIA) may facilitate an identification of an appropriate height.

Note that, the since the electrical components may be coupled to either one of the printed circuit boards 202 and 204 or to both of them, orientation of the electrical components may be freely adjusted so that the height of the electrical component matches the chosen thickness for the molding material 210. For example, if the thickness of the molding material 210 is 2.0 mm, a EIA 2012 capacitor may be rotated such that its length (prescribed to be 2.0 mm) is perpendicular to the PCB 202 while a EIA 2520 inductor may be rotated such that its width (prescribed to be 2.0 mm) is perpendicular to the PCB 202. It may be possible to employ electronic components with heights slightly smaller than the chosen thickness for the molding material 210 by using conductors such as solder ball, as detailed below. It may also be possible to employ electronic components with heights substantially smaller than the chosen thickness for the molding material 210 by coupling it to a single PCB (e.g., PCB 210), as detailed below.

Figure 9:
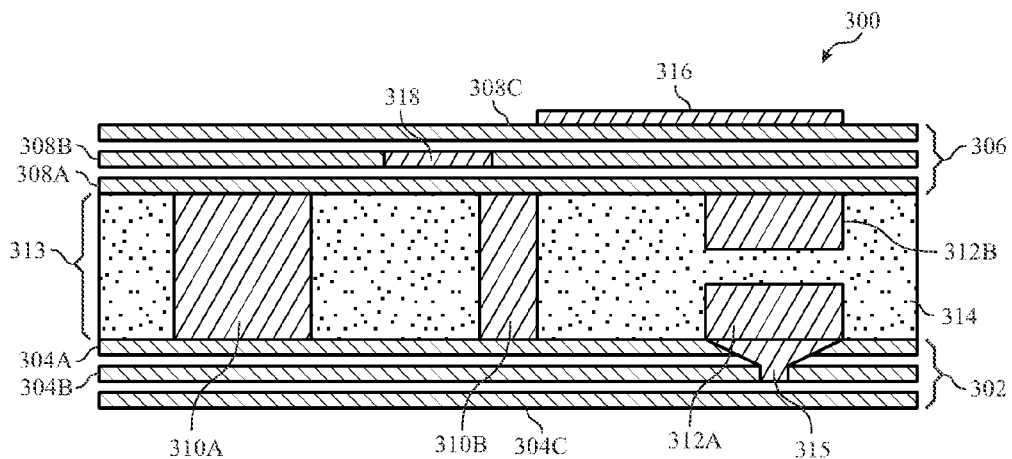
FIG. 9 presents a front view of a printed circuit board assembly with a molding disposed between two multilayer PCBs and that may be used in conjunction with any of the devices of FIGS. 1-6, in accordance with an embodiment.

It should be understood that the PCBs 202 and 204 in the printed circuit board assembly 200 may be single-layer PCBs or a multi-layer PCBs. FIG. 9 illustrates a front view of a printed circuit board assembly 300 in which a bottom PCB 302 is a 3-layer PCB with layers 304A, 304B, and 304C. A top PCB 306 of the printed circuit board assembly is also a 3-layer PCB with layer 308A, 308B, and 308C. Each layer 304A-C and 308A-C may have a wiring layout and pads to establish connections with respective electrical components such as 310A, 312A and 312B, and thru-mold via 310B. In some implementations, any of the layers 304A-C and 308A-C may be shielding layers, with a layout that mitigates interference between the printed circuit board assembly 300 and neighboring electrical devices. In some implementations, any of the layers 304A-C and 308A-C may be grounding layers that may improve the quality of ground connections in high frequency circuits that may be implemented in the printed circuit board assembly 300.

All the electrical components and the thru-mold vias are embedded by the molding material 314, forming a core 313 of the PCB assembly 300. Note that the components in the core 313, such as electrical components 310A, 312A, 312B, and thru-mold via 310B may be directly coupled to any of the layers 304A-C of the PCB 302, or layers 308A-C of PCB 306 to which the components physically connect. For example, a pad 315 of PCB 302 designed to connect to a terminal of electrical component 312A may be located in a second layer 304B. Note also that the multilayer PCBs 302 and 306 may have other coupled electronic components that are not embedded in the molded core 313, such as electrical component 316 located on a surface of multi-layer PCB 306 opposite to the core 313, and component 318 embedded within layer 308B of the multi-layer PCB 306.

Figure 10:
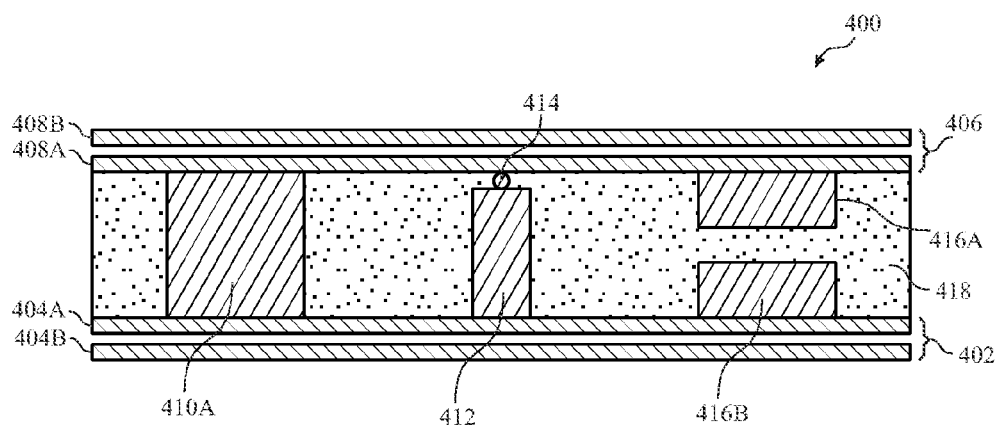
FIG. 10 presents a front view of a printed circuit board assembly with a molding disposed between two PCBs, solder balls being used to facilitate mounting of electronic components, and that may be used in conjunction with any of the devices of FIGS. 1-6, in accordance with an embodiment.

Electrical components may be mounted to PCBs through point-to-point mounting, direct soldering, surface-mount technology (SMT) methods, through-hole connection, and other appropriate methods. The printed circuit board assembly 400 illustrated in FIG. 10 provides an example where the electrical coupling between an electrical component and a PCB may be facilitated by other devices. Printed circuit board assembly 400 has a two-layer lower PCB 402 that includes layers 404A and 404B and a two-layer top PCB 406 that includes layers 408A and 408B. The PCB assembly 400 also has electrical components 410, 412, 416A, and 416B embedded in a molding material 418.

In this example, electrical components 410 and 412 may be electrically coupled to both the bottom PCB 402 and top PCB 406. Note that electrical component 410 is in direct physical contact with both PCB layers 402 and 406, whereas electrical component 412 is direct contact only with bottom PCB 402. The electrical coupling between electrical component 412 and top PCB 406 takes place via solder ball 414. As discussed above, the thickness of the molding material 418 may be determined by the tallest electrical component 410, as measured along a direction perpendicular to the PCBs 402 and 406. The solder ball 414 may facilitate connection between an electrical component 412, which may be shorter than electrical component 410 and, thus, shorter than the thickness of the molding material 418.

Placement of other conductive materials may be used in place of the solder ball 414 to facilitate the assembly of electrical components having different heights or heights different from a dimension standard being employed in the printed circuit board assembly 400. In the example, the solder ball 414 may allow the PCBs 402 and 406 to be substantially parallel to each other despite the distinction in heights between electronic components 410 and 412.

Figure 11:
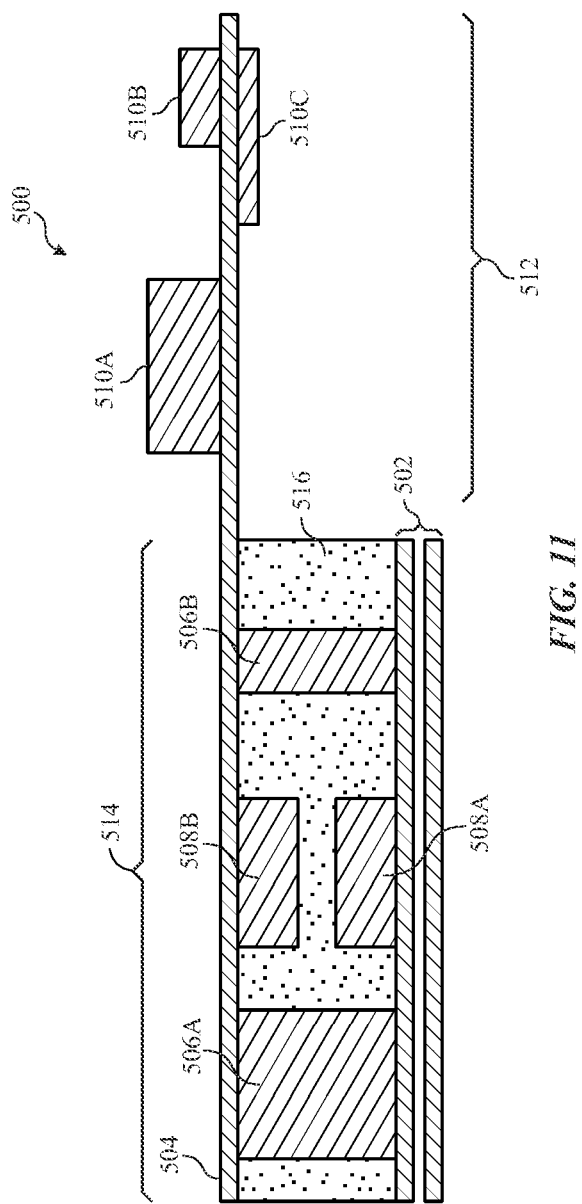
FIG. 11 presents a front view of a printed circuit board assembly presenting a region with molding disposed between two PCBs and a second region without a molding wherein the printed circuit board assembly may be used in conjunction with any of the devices of FIGS. 1-6, in accordance with an embodiment.

As mentioned above, molding material may provide changes in the mechanical properties to of a printed circuit board assembly such as increased stiffness. In some situations, however, it may be desirable for a region of a printed circuit board assembly to have flexibility. The printed circuit board assembly 500 illustrated in FIG. 11 allows for flexibility of different regions that may be adjusted, as desired, for use in various applications. The printed circuit board assembly 500 may have a bottom PCB 502 having two layers and, a top PCB 504. The printed circuit board assembly also includes electronic components 506A and 506B which may be directly coupled to PCBs 502 and 504, electronic component 508A that may be directly coupled to PCB 502 and electronic components 508B, 510A, 510B, and 510C that may be directly coupled to PCB 504. The printed circuit board assembly may have a flexible region 512 and a non-flexible region 514. The non-flexible region 514 may be stiffer due to the presence of a molding material 516 that is disposed between the bottom PCB 502 and top PCB 504. While in this example, the illustrated bottom PCB 502 is shorter than top PCB 504, a printed circuit board assembly 500 may have a flexible region 512 having more than one PCB, without a molding material with thickness that provides stiffness to the flexible region 512.

In some applications, the flexible region 512 may have connector in the top PCB 504 that may be inserted into a slot of an electrical device to obtain a robust integration between the printed circuit board assembly 500 and the electrical device. In applications where an electrical component may have a specification for physical space clearance, the electronic component may be added to a flexible region 512. Note also that in some applications, the flexible region 512 may be used to obtain a shape for the printed circuit board assembly 500 that fits inside a region of the electrical device with a corresponding shape.

Figure 12:
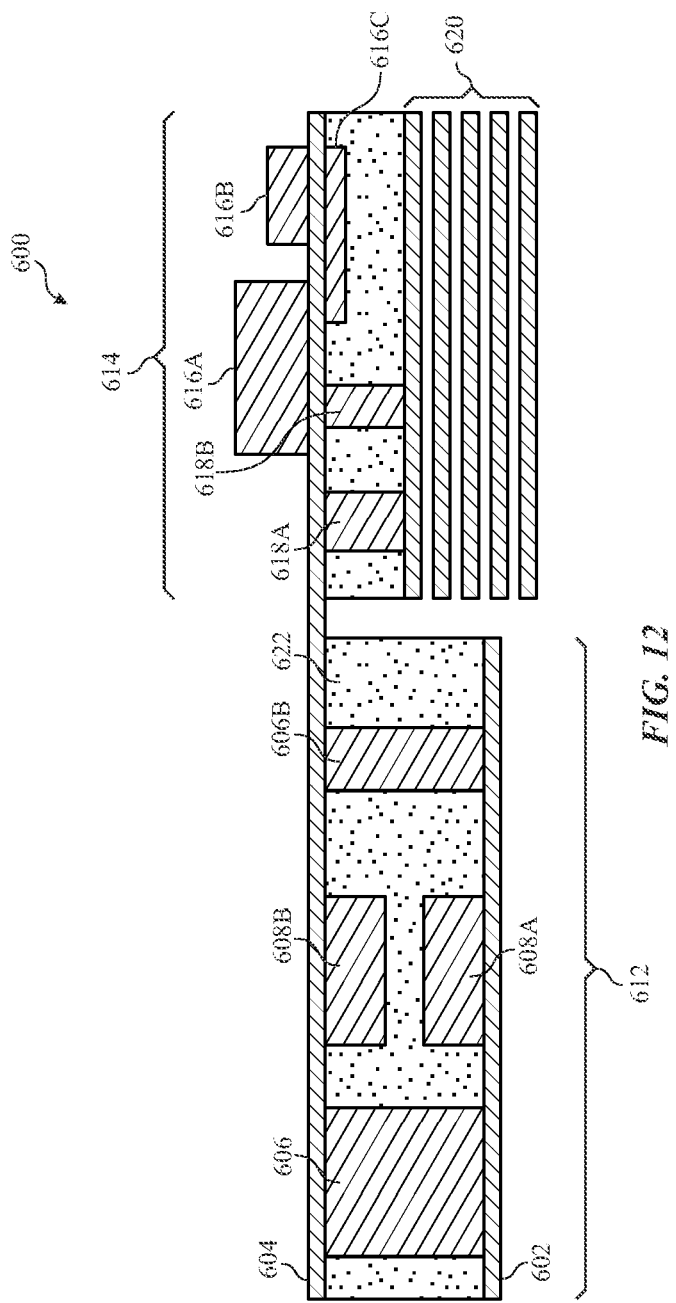
FIG. 12 presents a front view of a printed circuit board assembly presenting a molding in a first region of the printed circuit board assembly and a second molding with a different thickness in a second region of the printed circuit board assembly, wherein the printed circuit board assembly may be used in conjunction with any of the devices of FIGS. 1-6, in accordance with an embodiment.

To obtain more flexibility in the shape of a printed circuit board assembly, multiple molded cores may be used. FIG. 12 illustrates a printed circuit board assembly 600 that has two different molded cores. The printed circuit board assembly 600 may have a first PCB 602, a second PCB 604, and a 4-layer PCB 620. The PCBs 602, 604, and 620 may be coupled to electrical components 606A, 608A, 608B, 616A, 616B, 616C, 618A and thru-mold vias 606B and 618B. The region 612 of the printed circuit board assembly 600 may have a first molded core with a molding material 622 embedding electrical components 606, 608A, 608B, and thru-mold via 606B. The thickness of molding material 622 is determined by the height of electrical component material 606A.

The region 614 of the printed circuit board assembly 600 may also have second molded core with a molding material 624 embedding electrical components 618A, 616C, and thru-mold via 6188. Note the thickness of molding material 624 is smaller than the thickness of molding material 622. This arrangement may allow an improved arrangement of the electronic components and PCBs within the printed circuit board assembly 600. Note further that, based on a mechanical specification, the molding material 622, and the molding material 624 may be separated, allowing flexibility in the region of top PCB 604 between region 612 and region 614. In some applications, molding materials 622 and 624 may be formed from a single application of the resin.

Figure 13:
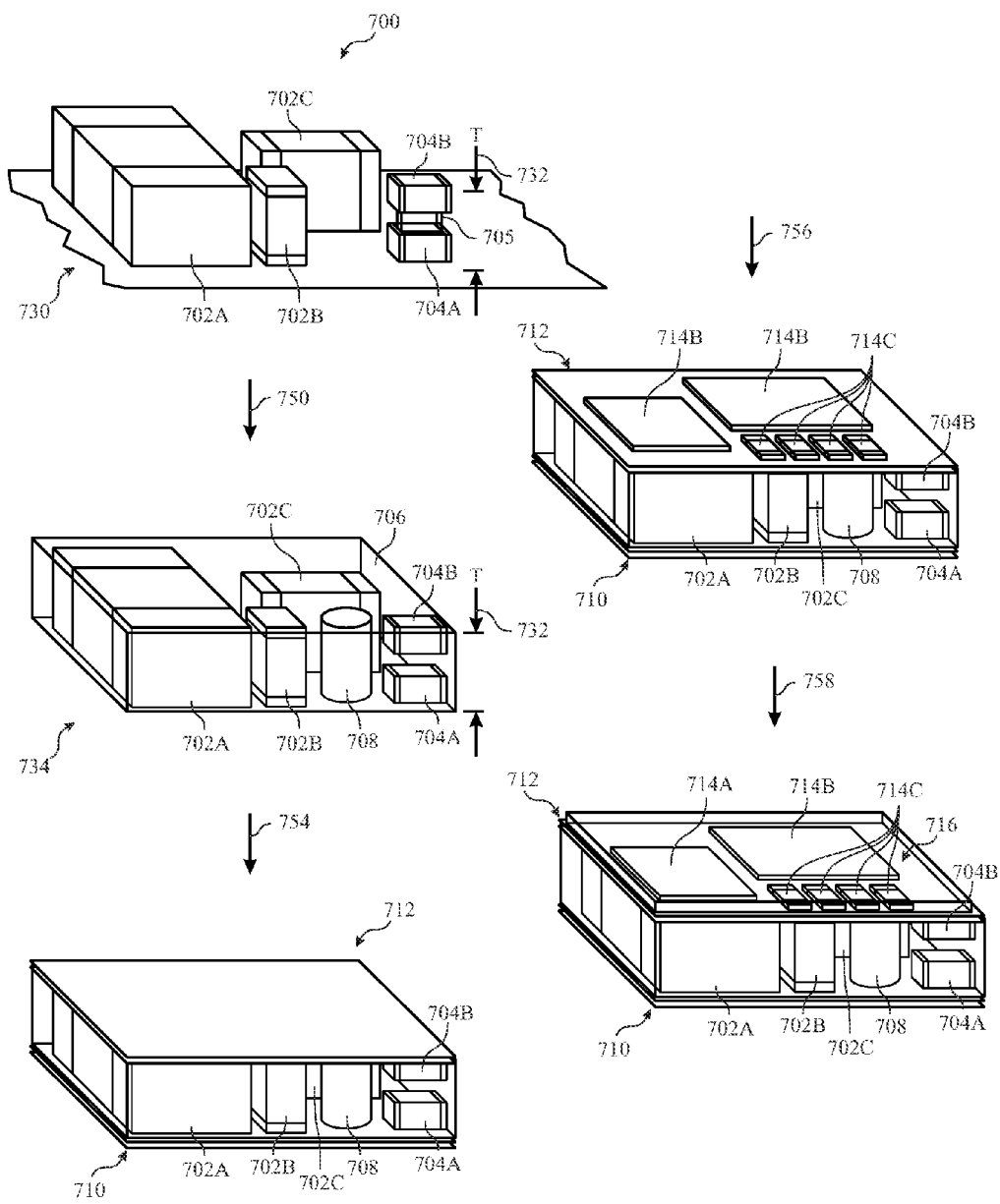
FIG. 13 illustrates a method to produce a printed circuit board assembly such as the printed circuit board assemblies illustrated in FIGS. 7-13, in accordance with an embodiment.

The printed circuit board assemblies 300, 400, 500, and 600, as discussed above and illustrated in FIGS. 7-12, include molded cores. The use of molded cores may facilitate assembly of printed circuit board assemblies by allowing for simplified attachment and shipment of parts, as detailed bellow. Flow diagram 700 in FIG. 13 provides an illustration of a method to assemble a printed circuit board assembly with a PCB with a molded core. To that end, the electronic components 702A, 702B, 702C, 704A, and 704B may be aligned with respect to a surface 730. Electronic components may be placed on surface 730, as is the case with electronic components 702A, 702B, 702C, and 704A.

A thickness 732, measured in a direction perpendicular to surface 730, may be determined as the height of the tallest electronic component. As discussed above, the use of standardized case sizes for the components may be beneficial for this arrangement. Note that electronic components may be rotated to obtain a height substantially similar to thickness 732. In some situations the component may be rotated to obtain a height that is substantially identical to thickness 732. Note further that some of the components may be arranged such that its height is not the one that approximate thickness 732. In some applications, where an electronic component may be shorter than thickness 732, a solder ball or some other conductive segment may be placed to obtain the final desired height, as discussed above.

Some components, such as electronic component 704B, may not be on surface 730 but may be part of the molded core, to be coupled to a PCB, as detailed below. Electrical component 704B may be disposed such that its top is aligned with a top of the molded core, based on the thickness 732. The arrangement may be enforced by the addition of a piece of mold 705 of adequate size between the electrical component 704A and 704B, or any other technique compatible with method 700.

In a molding injection process 750, a molding material 706 may be placed in the regions of the molded core that are not occupied by the electrical components 702A, 702B, 702C, 704A, and 704B. The molding material may have a thickness 732 substantially similar to the height of the tallest electronic component. Moreover, a hole in the mold may be produced and filled with conductive material to form a thru-mold via 708 with a height similar to thickness 732 to form the molded core 734. Note that the terminations of the electrical components 702A, 702B, 702C, 704A, and 704B and of the thru-mold via 708 are exposed in the surfaces of the molded core 734 to allow coupling between the electrical components and the printed circuit boards, as detailed below.

A bottom PCB 710 and a top PCB 712 may be affixed to molded core 734 in a soldering process 754. The PCBs 710 and 712 should be aligned with the molded core 734 such that the pads in PCBs 710 and 712 are substantially in contact with the electronic components of the molded core 734. The fixation may be done using SMT techniques such as reflow oven methods with solder paste, gas convections, focused infrared soldering, and other known methods. Since the electrical components are already arranged within the molded core 734, placement of the molded core is less complex than placement of multiple individual components. Care should be taken to avoid solder bridging during the single step fixation of the PCB to multiple components.

Further attachment of electrical components such as integrated circuits 714A, 714B, and 714C to the top of PCB 712 may take place in a second soldering process 756. Note that in this second soldering process, each part is placed individually for soldering on PCB 712, as opposed to the soldering process 754 discussed above. A second molding placement process 758 may then take place to introduce a second molding material 716 that encapsulates electrical components 714A, 714B, and 716A.

Note that process 756 and 758 may be replaced by a first molding injection process similar to process 750, to produce a core molding that includes electronic components 714A, 714B, and 714C, and a process similar to soldering process 754 to affix this core molding to the top of PCB 712. In general, the order of the processes may be changed based on a convenience of the production of printed circuit board assemblies.

The production of a core molding separate from the PCB may provide some flexibility in the process of fabrication. For example, the selection and arrangement of individual parts, as well as the molding injection (process 750) may take place in a location distinct from the location where PCBs 710 and 712 are produced. The PCBs 710 and 712 and a finalized molded core 734 may be shipped to a third location for soldering and finalization of the package. Moreover, the mechanical properties of the finalized printed circuit board assembly with a molded core 734 may reduce the damage incurred while shipping printed circuit board assemblies or electrical devices containing the printed circuit board assemblies.

The molded core 734 may also be considered a module in the design of a printed circuit board assembly. For example, if two distinct circuitries employ the same electrical design but have a different circuit topology (e.g., a wiring diagram), it may be possible to reuse the same molded core 734 with redesigned PCBs 710 and 712. This may decrease the cost in production or facilitate redesign of electrical devices based on older electrical devices, such as during version changes and/or upgrades.

In the described methods, a placement of a molding material between electrical components was discussed, such as in processes 750 and 758. In some implementations, placement of molding may take place through introduction of a liquid resin and subsequent curing of the material. In these situations, the molding material injection may use the assistance of a receptacle to contain the liquid resin. In other implementations, a placement of a semi-solid material (e.g. paste) with posterior curing may be employed. Curing may take place through drying of a material, cross-linking of a polymer or any other appropriate method that produces a molding material that is an electrical insulator. In other processes, the molding material may be cast with a mold that accounts for electrical component placement. The cast may be generated and the electrical components may be disposed in the cast based on the desired arrangement of the electrical components.

Figure 14:
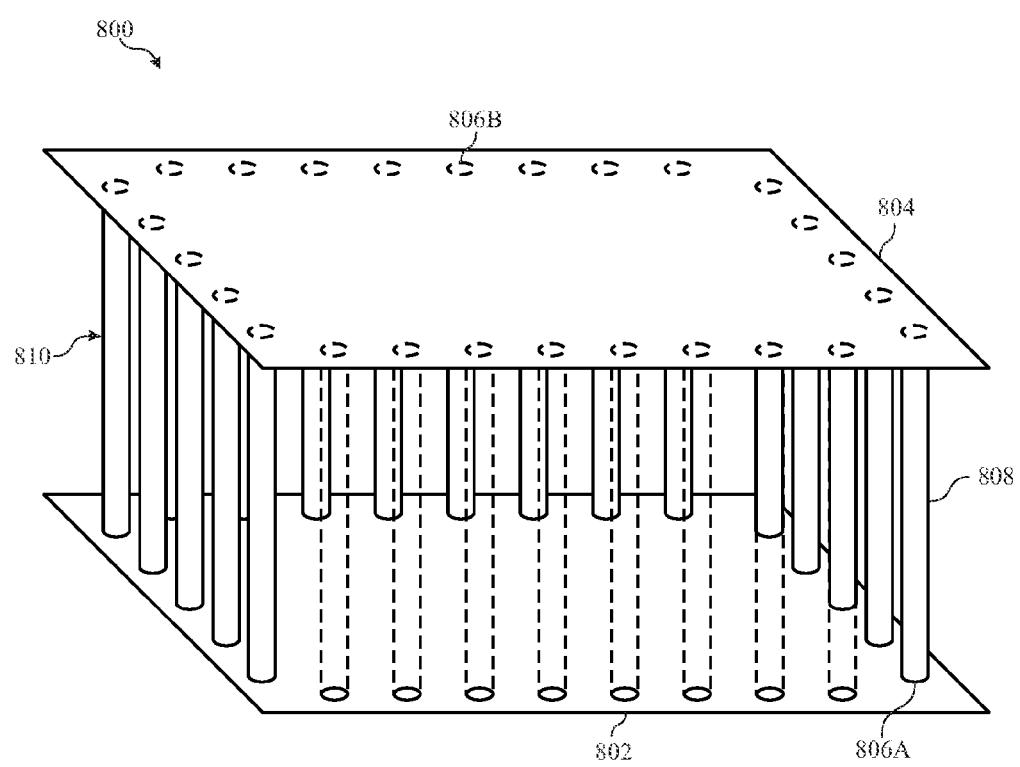
FIG. 14 illustrates a perspective view of a shielded printed circuit board assembly that may be used in conjunction with any of the devices of FIGS. 1-6.

As discussed above, the printed circuit board assemblies with molded core may facilitate the construction of shielding. The shielding assembly 800 illustrated in FIG. 14 provides such a system. A bottom PCB 802 and a top PCB 804 may be affixed to a molded core 810. The molded core 810 may have multiple electronic components (not illustrated) coupled to PCBs 802 and 804, as discussed above. Furthermore, the bottom PCB 802 and the top PCB 804 may have multiple shielding pads 806A and 806B, respectively that may be formed through sputtering or some other deposition method. In some implementations, the shielding pads may be electrically coupled to a grounding layer.

The shielding pads 806A of the bottom PCB 802 may be coupled to shielding pads 806B of the top PCB 804 through thru-mold vias 808. The thru-mold vias 808 may be produced through any of the previously discussed methods. The thru-mold vias 808 and the shielding pads 806A and 806B may form an electrical shielding to the electronic components within the shielding assembly 800. This shielding may take place through a Faraday cage effect or some other effect on the emission of electromagnetic waves. The separation between the thru-mold vias 808 should be adjusted accordingly to the strength of the electrical field, the magnetic field, and/or expected electromagnetic emission frequencies of the electrical device. Note that the shielding assembly 800 may be restricted to a region of a printed circuit board assembly, leaving certain regions unshielded. For example, in an electrical device that has an electromagnetic shielding, based on a specification of the electrical device.

Technical advantages of the embodiments presented herein include but are not limited to the production and use of SIPs and printed circuit board assemblies that may improve the utilization of space within electrical devices. This may be accomplished by decreasing the amount of empty space (i.e., with no electrical component) along a direction perpendicular to a printed circuit board, which may be a product of connecting electronical components to multiple printed circuit boards. The increased component density may also be decrease bending and warping that may happen in printed circuit boards with uneven weight distribution. Moreover, the use of molding may improve mechanical properties of the printed circuit board assembly, improving the resilience of electrical devices to mechanical impacts or vibrations.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A printed circuit board assembly comprising:
   a first printed circuit board;
   a first electrical component mounted and electrically coupled to the first printed circuit board and having a first height measured along a direction perpendicular to the first printed circuit board;
   a second electrical component mounted and electrically coupled to the first printed circuit board, and having a second height measured along the direction perpendicular to the first printed circuit board, the second height substantially identical to the first height;
   a second printed circuit board separated from the first printed circuit board by a distance substantially identical to the first height, wherein the first electrical component and the second electrical component are mounted to and electrically coupled to the second printed circuit board; and
   a mold occupying all portions of a first region of the first printed circuit board that are unoccupied by any electrical component disposed between the first printed circuit board and the second printed circuit board.

2. The printed circuit board assembly of claim 1, wherein the mold as measured in the direction perpendicular to the first printed circuit board is substantially identical to the first height.

3. The printed circuit board assembly of claim 1, wherein the first electrical component and the second electrical component each include at least one dimension that complies with a standard for a case size.

4. The printed circuit board assembly of claim 1, wherein the first height of the first electrical component is substantially 0.2 mm, 0.3 mm, 0.4 mm, 0.5 mm, 0.6 mm, 0.8 mm, 1.0 mm, 1.25 mm 1.5 mm, 1.6 mm, 2.0 mm, 2.5 mm, 3.2 mm, 4.5 mm, 5.0 mm, 6.3 mm, 5.1 mm, 7.3 mm, or 7.4 mm.

5. The printed circuit board assembly of claim 1, comprising a third electrical component disposed between the first printed circuit board and the second printed circuit board and mounted only to the first printed circuit board.

6. The printed circuit board assembly of claim 5, comprising a fourth electrical component disposed in a surface of the first printed circuit board opposite to the surface of the first printed circuit board to which the first electrical component is mounted.

7. The printed circuit board assembly of claim 1, wherein the first printed circuit board comprises a second region adjacent to the first region, wherein the second region does not comprise the mold.

8. The printed circuit board assembly of claim 7, wherein the second region comprises a third printed circuit board and a second mold occupying all portions of the second region of the printed circuit board that are unoccupied by any electrical component disposed between the first printed circuit board and the third printed circuit board.

9. The printed circuit board assembly of claim 7, wherein the second region of the first printed circuit board comprises a flexible region of the printed circuit board.

10. The printed circuit board assembly of claim 1, wherein the first printed circuit board is a multilayer printed circuit board.

11. The printed circuit board assembly of claim 1, wherein the first printed circuit board comprises a first shielding layer and the second printed circuit board comprises a second shielding layer, and wherein the mold comprises at least one via that electrically couples a first shielding pad in the first shielding layer and a second shielding pad in the second shielding layer.

12. The printed circuit board assembly of claim 1, wherein the first electrical component comprises a resistor, a capacitor, an inductor, or a semiconducting component.

13. A device comprising:
a first electrical component having a first height measured along a direction perpendicular to a plane;
a second electrical component having a first length substantially similar to the first height, and disposed such that the first length is oriented the direction perpendicular to the plane; and
a mold supporting the first electrical component and the second electrical component, wherein the mold has a thickness substantially similar to the first height as measured along the direction perpendicular to the plane, and wherein the first electrical component comprises a first termination disposed on a top of the mold and a second termination at a bottom of the mold, and wherein the second electrical component comprises a third termination disposed on the top of the mold and a fourth termination disposed on the bottom of the mold.

14. The device of claim 13, wherein the device is attached to a first printed circuit board on a first surface of the mold parallel to the plane, wherein the attachment of the first printed circuit board to the mold electrically couples the first electrical component and the second electrical component to the first printed circuit board, and the device is configured to be attached to a second printed circuit board on a second surface of the mold opposite to the first surface of the mold, wherein the attachment of the second printed circuit board to the mold electrically couples the first electrical component and the second electrical component to the second printed circuit board.

15. The device of claim 13, wherein the device comprises a solder ball in contact with the second electrical component, wherein the first length includes a dimension of the solder ball and the first length is substantially identical to the first height.

16. The device of claim 13, comprising a third electrical component supported by the mold and disposed such that a dimension of the third electrical component measured along a direction perpendicular to the plane is substantially smaller than the first height.

17. The device of claim 13, wherein the first electrical component comprises a resistor, a capacitor, an inductor, or a semiconducting component.

* * * * *